(12) United States Patent
Holden

(10) Patent No.: US 8,759,197 B2
(45) Date of Patent: Jun. 24, 2014

(54) MULTI-STEP AND ASYMMETRICALLY SHAPED LASER BEAM SCRIBING

(75) Inventor: James M. Holden, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 260 days.

(21) Appl. No.: 13/160,822

(22) Filed: Jun. 15, 2011

(65) Prior Publication Data

US 2012/0322232 A1 Dec. 20, 2012

(51) Int. Cl.
*H01L 21/00* (2006.01)

(52) U.S. Cl.
USPC .......................................... 438/462; 438/463

(58) Field of Classification Search
USPC ................................................ 438/460–464
See application file for complete search history.

(56) References Cited

U.S. PATENT DOCUMENTS

| | | | |
|---|---|---|---|
| 4,049,944 A | 9/1977 | Garvin et al. |
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |
| 6,057,180 A | 5/2000 | Sun et al. |
| 6,117,347 A | 9/2000 | Ishida |
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Restriction Requirement for U.S. Appl. No. 13/180,336 dated Sep. 11, 2012, 6 pages.

(Continued)

*Primary Examiner* — Richard Booth
(74) *Attorney, Agent, or Firm* — Blakely, Sokoloff, Taylor & Zafman LLP

(57) ABSTRACT

Methods of dicing substrates by both laser scribing and plasma etching. A method includes laser ablating material layers, the ablating leading with a first irradiance and following with a second irradiance, different than the first. An asymmetrically shaped beam having an asymmetrical spatial profile along the direction of travel, multiple passes of a beam adjusted to have different irradiance levels, and multiple laser beams having various irradiance levels may be utilized to ablate at least a mask with the first irradiance and expose the substrate with the second irradiance.

14 Claims, 12 Drawing Sheets

(56) References Cited

U.S. PATENT DOCUMENTS

| | | | |
|---|---|---|---|
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 * | 9/2010 | Deshi | 219/121.67 |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 * | 3/2011 | Arita et al. | 438/462 |
| 7,923,351 B2 | 4/2011 | Arita | |
| 7,926,410 B2 | 4/2011 | Bair | |
| 7,927,973 B2 | 4/2011 | Haji et al. | |
| 2001/0035401 A1 | 11/2001 | Manor | |
| 2002/0012345 A1 | 1/2002 | Kalkunte et al. | |
| 2002/0042189 A1 | 4/2002 | Tanaka | |
| 2003/0045101 A1 | 3/2003 | Flanner et al. | |
| 2003/0152756 A1 | 8/2003 | Yamada et al. | |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2004/0259329 A1 | 12/2004 | Boyle et al. | |
| 2006/0024924 A1 | 2/2006 | Haji et al. | |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2007/0272555 A1 | 11/2007 | Baird | |
| 2007/0272666 A1 | 11/2007 | O'Brien et al. | |
| 2008/0283848 A1 | 11/2008 | Yamazaki | |
| 2009/0176375 A1 | 7/2009 | Benson et al. | |
| 2009/0255911 A1 | 10/2009 | Krishnaswami et al. | |
| 2009/0321748 A1 | 12/2009 | Lee | |
| 2010/0013036 A1 | 1/2010 | Carey | |
| 2010/0025387 A1 | 2/2010 | Arai et al. | |
| 2010/0048001 A1 | 2/2010 | Harikai et al. | |
| 2010/0120227 A1 | 5/2010 | Grivna et al. | |
| 2010/0120230 A1 | 5/2010 | Grivna et al. | |
| 2010/0246611 A1 | 9/2010 | Sun | |
| 2010/0248451 A1 | 9/2010 | Pirogovsky et al. | |
| 2011/0029124 A1* | 2/2011 | Boyle et al. | 700/121 |
| 2013/0045554 A1 | 2/2013 | Yamazaki | |
| 2013/0065378 A1 | 3/2013 | Johnson et al. | |
| 2013/0230972 A1 | 9/2013 | Johnson et al. | |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| JP | 2007281526 | 10/2007 |
| JP | 2009034694 | 2/2009 |
| JP | 2010165963 | 7/2010 |
| KR | 20100020727 | 2/2010 |
| WO | WO-03036712 | 5/2003 |
| WO | WO-03071591 | 5/2003 |
| WO | WO-2011163149 | 12/2011 |
| WO | WO-2012173758 | 12/2012 |
| WO | WO-2012173759 | 12/2012 |
| WO | WO-2012173768 | 12/2012 |
| WO | WO-2012173770 | 12/2012 |

OTHER PUBLICATIONS

International Search Report and Written Opinion from PCT/US2012/040303 mailed Dec. 28, 2012, 9 pages.

Restriction Requirement for U.S. Appl. No. 13/161,006 Mailed Jan. 10, 2013, 6 Pages.

International Search Report and Written Opinion for PCT Patent Application No. PCT/US2012/040295 Mailed Dec. 27, 2012, 11 Pages.

Restriction Requirement for U.S. Appl. No. 13/161,026 Mailed Jan. 17, 2013, 6 Pages.

International Search Report and Written Opinion from PCT/US2012/040307 mailed Dec. 28, 2012, 9 pgs.

International Search Report and Written Opinion for PCT Patent Application No. PCT/US2012/039746 Mailed Dec. 26, 2012, 10 Pages.

Restriction Requirement for U.S. Appl. No. 13/161,036 Mailed Feb. 1, 2013, 6 Pages.

Restriction Requirement for U.S. Appl. No. 13/160,973 Mailed Jan. 9, 2013, 6 Pages.

International Search Report and Written Opinion for PCT Patent Application No. PCT/US2012/039207 Mailed Dec. 26, 2012, 12 Pages.

International Search Report and Written Opinion for PCT Patent Application No. PCT/US2012/039209 Mailed Dec. 26, 2012, 8 Pages.

International Search Report and Written Opinion for PCT Patent Application No. PCT/US2012/039205 Mailed Dec. 26, 2012, 11 Pages.

International Search Report and Written Opinion for PCT Patent Application No. PCT/US2012/039753 Mailed Dec. 26, 2012, 9 Pages.

International Search Report and Written Opinion for PCT Patent Application No. PCT/US2012/040289 Mailed Jan. 2, 2013, 11 Pages.

International Search Report and Written Opinion for PCT Patent Application No. PCT/US2011/041126 Mailed Feb. 21, 2012, 10 Pages.

International Preliminary Report on Patentability for PCT Patent Application No. PCT/US2011/041126 Mailed Jan. 10, 2013, 7 Pages.

Restriction Requirement for U.S. Appl. No. 13/161,045 Mailed Feb. 19, 2013, 5 Pages.

Van Borkulo, Jeroen, et al., "Enabling Technology in Thin Wafer Dicing", The Electrochemical Society, vol. 18, Issue 1, Packaging Technology, 2009, pp. 837-842.

Non-Final Office Action for U.S. Appl. No. 13/180,336 Mailed Feb. 6, 2013, 15 Pages.

Linder, et al., "Water-Soluble Sacrificial Layers for Surface Micromachining", www.small-journal.com, 2005, 1, No. 7, 7 Pages.

Singh, et al., "Apparatus and Methods for Dry Etch With Edge, Side and Back Protection", U.S. Appl. No. 61/491,693, filed May 31, 2011 24 pgs.

Addae-Mensah et al., "Poly(vinyl alcohol) as a structure release layer for the microfabrication of polymer composite structures", IOP Publishing. Journal of Micromechanics and Microengineering, 17 (2007), pp. N41-N46.

US 4,339,538, 07/1982, Goldman (withdrawn)

* cited by examiner

MULTI-STEP AND ASYMMETRICALLY SHAPED LASER BEAM SCRIBING

TECHNICAL FIELD

Embodiments of the present invention pertain to the field of semiconductor processing and, in particular, to methods for dicing substrates, each substrate having an integrated circuit (IC) thereon.

BACKGROUND DESCRIPTION OF RELATED ART

In semiconductor substrate processing, ICs are formed on a substrate (also referred to as a wafer), typically composed of silicon or other semiconductor material. In general, thin film layers of various materials which are either semiconducting, conducting or insulating are utilized to form the ICs. These materials are doped, deposited and etched using various well-known processes to simultaneously form a plurality of ICs, such as memory devices, logic devices, photovoltaic devices, etc, in parallel on a same substrate.

Following device formation, the substrate is mounted on a supporting member such as an adhesive film stretched across a film frame and the substrate is "diced" to separate each individual device or "die" from one another for packaging, etc. Currently, the two most popular dicing techniques are scribing and sawing. For scribing, a diamond tipped scribe is moved across a substrate surface along pre-formed scribe lines. Upon the application of pressure, such as with a roller, the substrate separates along the scribe lines. For sawing, a diamond tipped saw cuts the substrate along the streets. For thin substrate singulation, such as <150 μms (μm) thick bulk silicon singulation, the conventional approaches have yielded only poor process quality. Some of the challenges that may be faced when singulating die from thin substrates may include microcrack formation or delamination between different layers, chipping of inorganic dielectric layers, retention of strict kerf width control, or precise ablation depth control.

While plasma dicing has also been contemplated, a standard lithography operation for patterning resist may render implementation cost prohibitive. Another limitation possibly hampering implementation of plasma dicing is that plasma processing of commonly encountered interconnect metals (e.g., copper) in dicing along streets can create production issues or throughput limits. Finally, masking of the plasma dicing process may be problematic, depending on, inter alia, the thickness and top surface topography of the substrate, the selectivity of the plasma etch, and the materials present on the top surface of the substrate.

SUMMARY

Embodiments of the present invention include methods of laser scribing substrates. In the exemplary embodiment, the laser scribing is implemented as a first operation in a hybrid dicing process including both laser scribing and plasma etching.

In an embodiment, a method of dicing a semiconductor substrate having a plurality of ICs includes receiving a masked semiconductor substrate, the mask covering and protecting ICs on the substrate. The masked substrate is ablated along streets between the ICs with a point on the substrate exposed to increasing irradiance. In one embodiment, at least a portion of the mask thickness in the street is ablated through exposure to electromagnetic radiation of first irradiance (optical intensity) to provide a patterned mask with gaps or trenches. At least a portion of a thin film device layer stack disposed below the mask is then ablated through exposure to electromagnetic radiation having second irradiance to expose regions of the substrate between the ICs. The ICs are then singulated into chips, for example by plasma etching through the exposed substrate following the trenches in the patterned mask.

In another embodiment, a system for dicing a semiconductor substrate includes a laser scribe module and a plasma etch chamber, integrated onto a same platform. The laser scribe module is to iteratively scribe the substrate and the plasma chamber is to etch through the substrate and singulate the IC chips. The laser scribe module may include one or more of a multiple lasers, a multi-pass controller, or a beam shaper to scribe the substrate via exposure to a plurality of optical intensities.

In another embodiment, a method of dicing a substrate having a plurality of ICs includes receiving a masked silicon substrate. The ICs include a copper bumped top surface having bumps surrounded by a passivation layer, such as polyimide (PI). Subsurface thin films below the bumps and passivation include a low-κ interlayer dielectric (ILD) layer and a layer of copper interconnect, the entire set of layers comprising a device film layer stack. A femtosecond laser ablates, through irradiation, a predetermined pattern of trenches into the film layer stack by one or more sequential laser irradiation steps and into a thin film IC stack disposed below the mask with a second irradiance to expose a portion of a substrate and may further ablate into the same substrate such that there is sufficiently small amounts of residual film layer stack remaining on the substrate at the trench bottoms. The ablation leads with a first irradiance and follows with a second irradiance greater than, less than, or essentially equal to the first irradiance. The kerf width may additionally be reduced or increased with changing irradiance. A plasma etch is performed in a plasma etch chamber to additionally remove substrate material below the removed film layer stack to singulate individual ICs out of the single substrate. Any remaining mask material is then removed by a suitable method such as washing by solvent or dry plasma cleaning.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
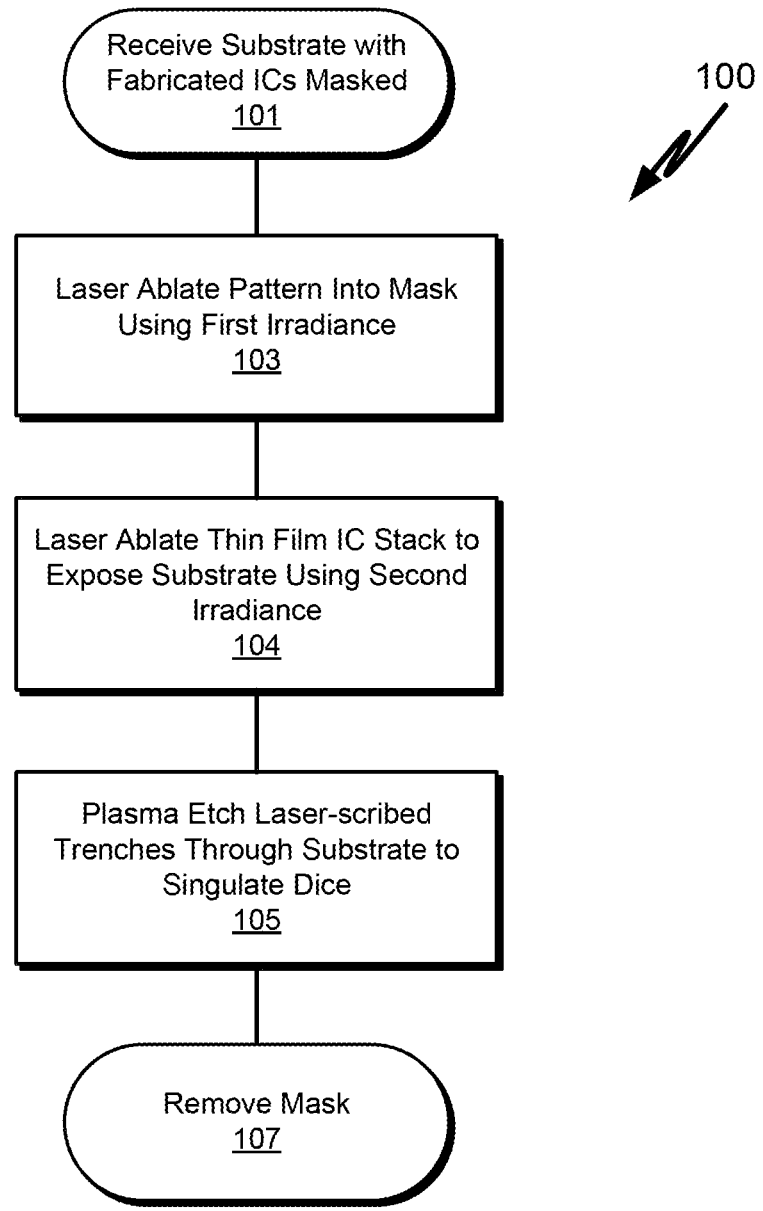
FIG. 1 is a flow diagram illustrating a hybrid laser ablation-plasma etch singulation method with a laser scribing process leading with a first irradiance and following with a second irradiance, in accordance with an embodiment of the present invention.

Methods of dicing substrates, each substrate having a plurality of ICs thereon, are described. In the following description, numerous specific details are set forth, such as femtosecond laser scribing and deep silicon plasma etching conditions in order to describe exemplary embodiments of the present invention. However, it will be apparent to one skilled in the art that embodiments of the present invention may be practiced without these specific details. In other instances, well-known aspects, such as IC fabrication, substrate thinning, taping, etc., are not described in detail to avoid unnecessarily obscuring embodiments of the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the Figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other material layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Generally, described herein is a laser scribe process employing a plurality of optical intensities to cleanly ablate a predetermined path through an unpatterned (i.e., blanket) mask layer, a passivation layer, and subsurface thin film device layers. The laser scribe process may then be terminated upon exposure of, or partial ablation of, the substrate. The ablation processing employs first of a plurality of optical intensities to remove upper layers (e.g., mask and thin film device layers) which are more easily damaged relative to the substrate and/or other thin film device layers. Subsequent ablation down to and including a portion of the substrate may then proceed without exposing the easily damaged layers to the higher intensity radiation employed. As employed herein the term "iterative ablation" refers to an ablation process which exposes a point on a substrate to laser radiation having a plurality of optical intensities.

In accordance with an embodiment of the present invention, at least a portion of the iterative laser scribing process employs a femtosecond laser. Femtosecond laser scribing is an essentially, if not completely, non-equilibrium process. For example, the femtosecond-based laser scribing may be localized with a negligible thermal damage zone. In an embodiment, femtosecond laser scribing is used to singulate ICs having ultra-low κ films (i.e., with a dielectric constant below 3.0). In one embodiment, direct writing with a laser eliminates a lithography patterning operation, allowing the masking material to be something other than a photo resist as is used in photolithography. In the exemplary hybrid dicing embodiment, an iterative laser scribing process is followed by a plasma etch through the bulk of the substrate. In one such embodiment, a substantially anisotropic etching is used to complete the dicing process in a plasma etch chamber; the anisotropic etch achieving a high directionality into the substrate by depositing on sidewalls of the etched trench an etch polymer.

FIG. 1 is a flow diagram illustrating a hybrid laser ablation-plasma etch singulation method 100 employing iterative laser scribing, in accordance with an embodiment of the present invention. FIGS. 4A-4D illustrate cross-sectional views of a substrate 406 including first and second ICs 425, 426 corresponding to the operations in method 100, in accordance with an embodiment of the present invention.

Figure 4A:
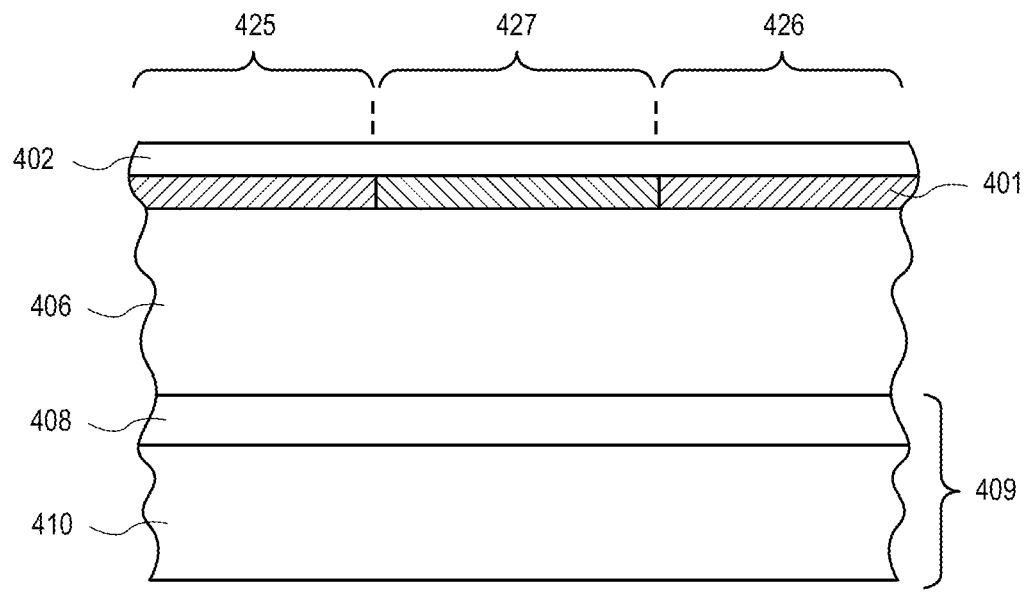
FIG. 4A illustrates a cross-sectional view of a substrate including a plurality of ICs corresponding to operation 101 of the dicing method illustrated in FIG. 1, in accordance with an embodiment of the present invention.

Referring to operation 101 of FIG. 1, and corresponding FIG. 4A, a substrate 406 is received. The substrate 406 includes a mask 402 covering a thin film device layer stack 401 comprising a plurality of distinct materials found both in the ICs 425, 426 and intervening street 427 between the ICs 425, 426. Generally, the substrate 406 is composed of a material suitable to withstand a fabrication process of the thin film device layers formed thereon and may also have other property requirements, for example, in silicon-based transistor ICs, where the substrate forms a part of active devices. For example, in one embodiment, substrate 406 is a group IV-based material such as, but not limited to, monocrystalline silicon, germanium or silicon/germanium. In another embodiment, substrate 406 is a III-V material such as, e.g., a III-V material substrate used in the fabrication of light emitting diodes (LEDs). During device fabrication, the substrate 406 is typically 600 µm-800 µm thick, but as illustrated in FIG. 4A may have been thinned to less than 400 µm and sometimes thinner than 150 um with the thinned substrate now supported by a carrier 411, such as a backing tape 410 stretched across a support structure of a dicing frame (not illustrated) and adhered to a backside of the substrate with a die attach film (DAF) 408.

In embodiments, first and second ICs 425, 426 include memory devices or complimentary metal-oxide-semiconductor (CMOS) transistors fabricated in a silicon substrate 406 and encased in a dielectric stack. A plurality of metal interconnects may be formed above the devices or transistors, and in surrounding dielectric layers, and may be used to electrically couple the devices or transistors to form the ICs 425, 426. Materials making up the street 427 may be similar to or the same as those materials used to form the ICs 425, 426. For example, street 427 may include thin film layers of dielectric materials, semiconductor materials, and metallization. In one embodiment, the street 427 includes a test device similar to the ICs 425, 426. The width of the street 427 may be anywhere between 10 µm and 200 µm, measured at the thin film device layer stack/substrate interface.

In embodiments, the mask 402 may be one or more material layers including any of a plasma deposited polymer (e.g., $C_xF_y$), a water soluble material (e.g., poly(vinyl alcohol)), a photoresist, or similar polymeric material which may be removed without damage to an underlying passivation layer, which is often polyimide (PI) and/or bumps, which are often copper. The mask 402 is to be of sufficient thickness to survive a plasma etch process (though it may be very nearly consumed) and thereby protect the copper bumps which may be damaged, oxidized, or otherwise contaminated if exposed to the substrate etching plasma.

Figure 5:
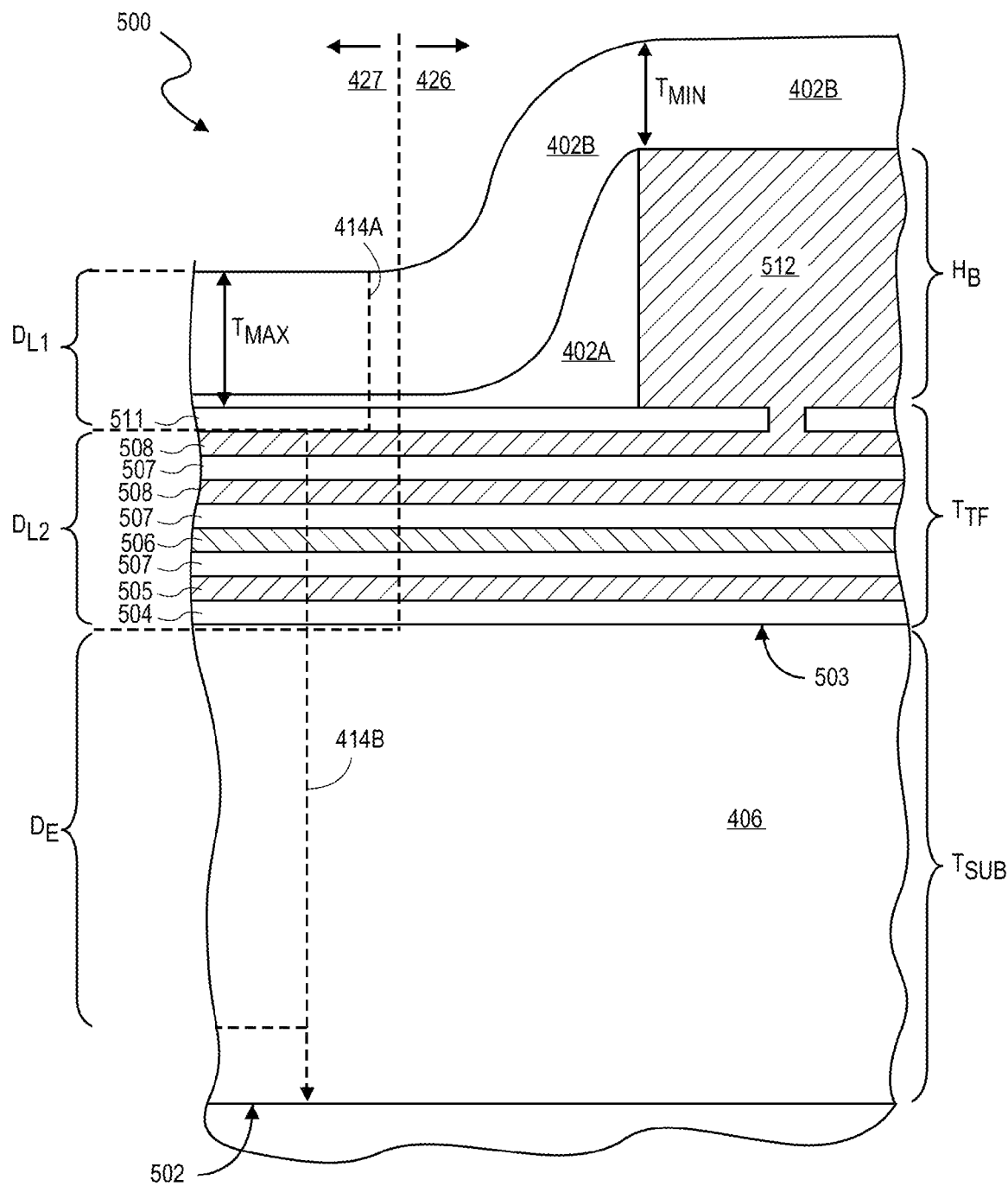
FIG. 5 illustrates an expanded cross-sectional view of an mask and thin film device layer stack ablated by a laser and plasma etched, in accordance with embodiments of the present invention.

FIG. 5 illustrates an expanded cross-sectional view 500 of a bi-layer mask including a mask layer 402B (e.g., $C_xF_y$ polymer) applied over a mask layer 402A (e.g., a water soluble material) in contact with a top surface of the IC 426 and the street 427, in accordance with embodiments of the present invention. As shown in FIG. 5, the substrate 406 has a top surface 503 upon which thin film device layers are disposed which is opposite a bottom surface 502 which interfaces with the DAF 408 (FIG. 4A). Generally, the thin film device layer materials may include, but are not limited to, organic materials (e.g., polymers), metals, or inorganic dielectrics such as silicon dioxide and silicon nitride. The exemplary thin film device layers illustrated in FIG. 5 include a silicon dioxide layer 504, a silicon nitride layer 505, copper interconnect layers 508 with low-κ (e.g., less than 3.5) or ultra low-κ (e.g., less than 3.0) interlayer dielectric layers (ILD) such as carbon doped oxide (CDO) disposed there between. A top surface of the IC 426 includes a bump 512, typically copper, surrounded by a passivation layer 511, typically a polyimide (PI) or similar polymer. The bump 512 and passivation layer 511 therefore make up a top surface of the IC with the thin film device layers forming subsurface IC layers. The bump 512 extends from a top surface of the passivation layer 511 by a bump height $H_B$ which in the exemplary embodiments ranges between 10 µm and 50 µm. One or more layers of the mask may not completely cover a top surface of the bump 512.

Referring back to FIG. 1, at operation 103 a predetermined pattern is directly written into the mask 402 with a first ablation along a controlled path relative to the substrate 406. As illustrated in corresponding FIG. 4B, the mask 402 is patterned in the first ablation by laser radiation 411 to form trench 414A extending through at least a portion of the mask thickness. In the exemplary embodiment illustrated in FIG. 5, the laser scribing depth $D_{L1}$ is approximately in the range of 5 µm to 30 µm deep, advantageously in the range of 10 µm to 20 µm deep, depending on the thickness of the mask layers 402A and 402B. The first irradiance $I_1$ is insufficient to ablate some layer of the thin film device layer stack 401 and therefore at least some portion of the thin film device layer stack 401 remains at the bottom of the trench 414A following operation 103. In one such embodiment, the first irradiance $I_1$ is insufficient to ablate an interconnect metal (e.g., interconnect copper layer 508) and/or a dielectric layer (e.g., silicon dioxide layer 504) of the thin film device layer stack 401.

At operation 104, the predetermined pattern is directly written with a second ablation iteration along the controlled path relative to the substrate 406. Referring to the exemplary embodiment in FIG. 4C, the substrate 406 is exposed to the second ablation iteration by laser radiation 412 forming trench 414B extending through at least a portion of the thin film device layer stack 401. In a first embodiment, as illustrated in FIG. 5, the laser scribing depth $D_{L2}$ is again approximately in the range of 5 µm to 30 µm deep, advantageously in the range of 10 µm to 20 µm deep, depending on the thickness of the mask layers 402A and 402B to expose the substrate.

Depending on the embodiment the laser radiation 412 (FIG. 4C) has a second irradiance $I_2$ that is either same or different than the first irradiance $I_1$. In embodiments where the irradiance $I_2$ is the same as $I_1$, successive scribing allows for total energy applied to be spread over time to reduce damage of the scribing process. For certain such embodiments, kerf width may be different between $I_1$ and $I_2$ for further improvement in cleanliness of the ablated edge. In embodiments where the irradiance $I_2$ is different than $I_1$, the irradiance $I_2$ is preferably greater than $I_1$, for example with the second irradiance $I_2$ sufficient to ablate an interconnect metal and/or a dielectric layer of the thin film device layer stack 401, although $I_2$ may also be less than $I_1$ where the goal is primarily to spread ablation over time. In the exemplary embodiment, the second irradiance $I_2$ is sufficient to ablate every layer of the thin film device layer stack 401 and therefore operation 103 leaves the substrate 406 exposed at the bottom of the trench 414B. In a further embodiment, the second irradiance is sufficient to ablate a portion of the substrate 406, (e.g., single crystalline silicon) to extend the bottom of the trench 414B below the top surface of the substrate 406.

Figure 3A:
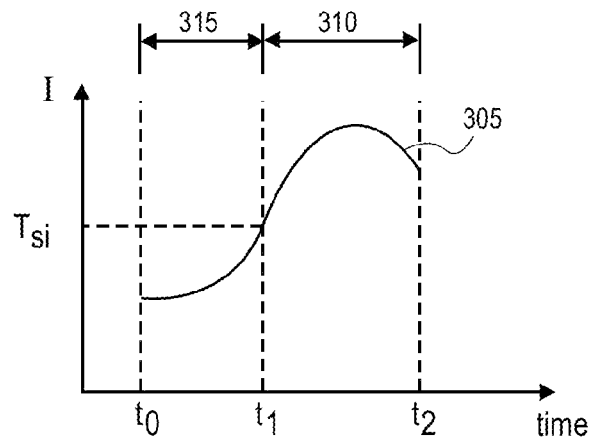
FIG. 3A is a graph of irradiance over time for a laser scribing process, in accordance with an embodiment of the present invention.
Figure 4B:
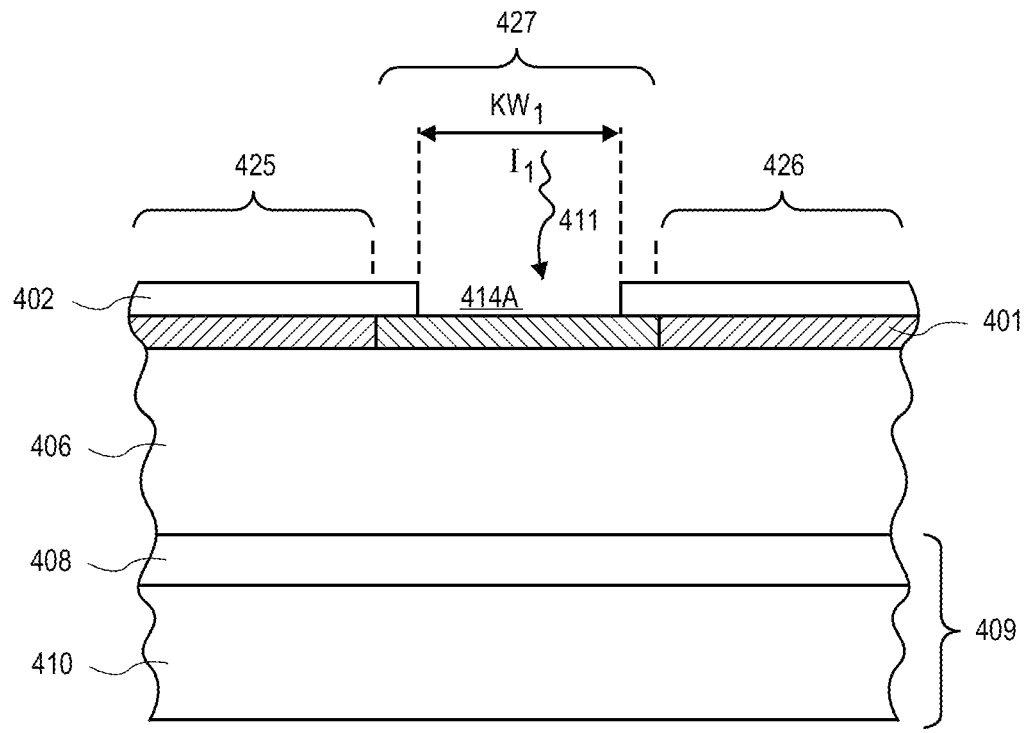
FIG. 4B illustrates a cross-sectional view of a substrate including a plurality of ICs corresponding to operation 103 of the dicing method illustrated in FIG. 1, in accordance with an embodiment of the present invention.
Figure 4C:
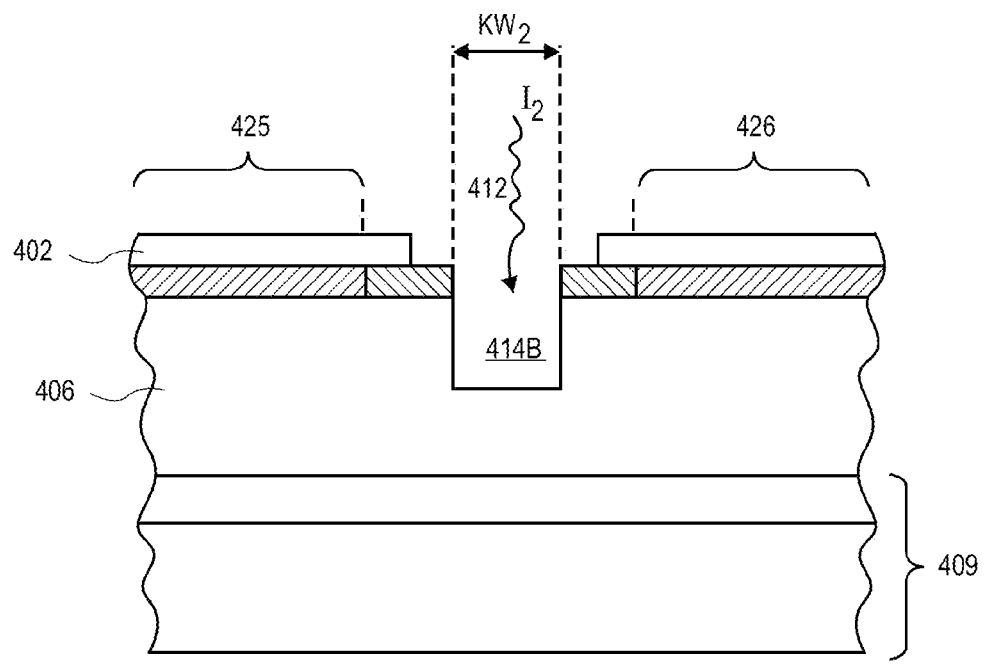
FIG. 4C illustrates a cross-sectional view of a substrate including a plurality of ICs corresponding to operation 104 of the dicing method illustrated in FIG. 1, in accordance with an embodiment of the present invention.

As further illustrated in FIGS. 4B 4C, the trench 414A has a first kerf width ($KW_1$) which is a function of a beam width possessing an energy greater than a threshold associated for the particular material of the mask 402 and the trench 414B has a second kerf width $KW_2$ as function of a beam width possessing an energy greater than a greatest threshold associated for the materials in the thin film device layer stack 401. In a first embodiment, the first kerf width $KM_1$ is larger than the second kerf width $KW_2$ so the mask 402 and upper layers of the thin film device stack 401 ablated at the first irradiance $I_1$ are not further disturbed by ablation of the underlying material layers ablated at the higher irradiance $I_2$. Notably in the exemplary embodiment, the entire first kerf width $KW_1$ is ablated to substantially the same depth as no point within the beam profile defining the kerf width $KW_1$ (perpendicular to direction of travel) has sufficient irradiance to ablate the entire thickness of the device stack. This is in contrast to a beam having a Gaussian spatial profile having a first irradiance at an outer perimeter of the beam diameter and a second irradiance within an inner diameter of the beam so that as the beam travels the leading edge of the beam makes a first kerf width $KW_1$ smaller than that of the inner beam diameter. In certain such embodiments, the second width $KW_2$ is between 10% and 50% smaller than the first kerf width $KW_2$ As one exemplary embodiment, the first kerf width $KW_1$ is less than 15 μM while the second kerf width $KW_2$ is 6 μm to 10 μm FIG. 3A is a graph of irradiance over time for an iterative laser scribing process, in accordance with an embodiment of the present invention. As shown, irradiance (W/cm$^2$) curve 305 is plotted for a particular point on the substrate along the ablation path. Beginning at time $t_0$, the point is exposed to radiation having a first irradiance $I_1$ for the duration of a leading portion 315. At time $t_1$, irradiation of the radiation increases above a threshold T, for example the threshold energy of a single crystalline substrate material, $T_{Si}$, where the ablation rate begins to increase substantially, which might generally be in the range of 0.01 GW/cm$^2$ and 1 GW/cm$^2$. Beginning at time $t_1$, the point is exposed to radiation having a second irradiance $I_2$ for the duration of a trailing portion 310, ending at time $t_2$. For the exemplary embodiment, the second irradiance $I_2$ is above the threshold energy of a single crystalline substrate material, $T_{Si}$. In alternate embodiments, the threshold between $I_1$ and $I_2$ is demarked by a threshold associated for any of the mask material (generally in the range of 0.0001 GW/cm$^2$ and 0.001 GW/cm$^2$), dielectric layer of the thin film device layer stack 401 (generally in the range of 0.1 GW/cm$^2$ and 10 GW/cm$^2$), or an interconnect layer of the thin film device layer stack 401 (generally be in the range of 0.01 GW/cm$^2$ and 0.1 GW/cm$^2$).

Figure 3B:
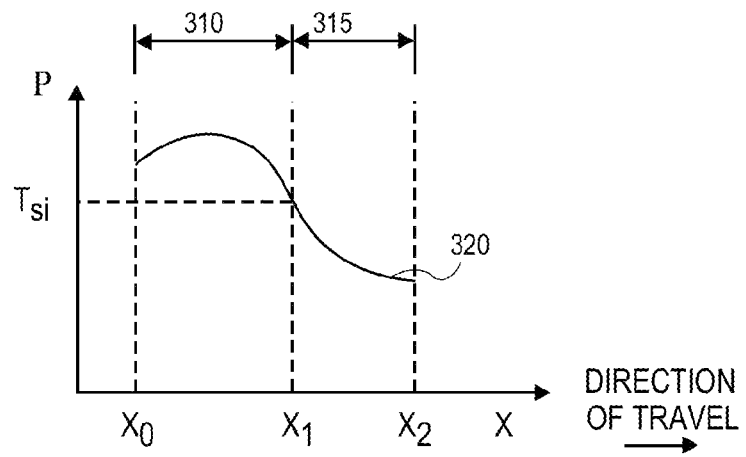
FIG. 3B is a graph of a spatial profile of an asymmetric laser beam for a single-pass laser scribing process, in accordance with an embodiment of the present invention.

Iterative ablation (e.g., operations 103 and 104) may be implemented in a number of manners to achieve the change in irradiance illustrated in FIG. 3A. In one embodiment, a laser beam is shaped to have a spatially varying irradiance profile along a direction of travel with the first portion providing the first ablation iteration and second portion providing the second ablation iteration. FIG. 3B is a graph of a spatial profile 320 of an asymmetrically shaped laser beam for a single-pass iterative laser scribing process, in accordance with an embodiment of the present invention. With power (P) plotted along the dimension x, with x increasing along a direction of travel, the spatial profile 320 includes a leading edge portion 315 and a trailing edge portion 310. The leading portion 315 has a lower power (P) than the trailing portion 310 to provide a first irradiance $I_1$ spanning the distance $x_1$ to $x_2$ while a second irradiance $I_2$ spans the distance $x_0$ to $x_1$. With $x_0$ to $x_2$ representing the beam width along the direction of travel (whether measured by D4σ, 10/90 knife-edge, 1/e2, FWHM, etc.) for a given width perpendicular to the direction of travel (i.e., y), in the exemplary embodiment illustrated, the trailing edge portion 310 is off-center within the beam width along the direction of travel (i.e., asymmetrical). As further shown in FIG. 3B, at $x_1$, power exceeds the threshold energy associated with a silicon substrate $T_{Si}$ such that the leading portion 315 does not have sufficient energy to ablate the entire thin film device layer stack 401 while the trailing portion 310 does have sufficient energy to ablate the entire thin film device layer stack 401 as well as a portion of a silicon substrate.

Figure 2A:
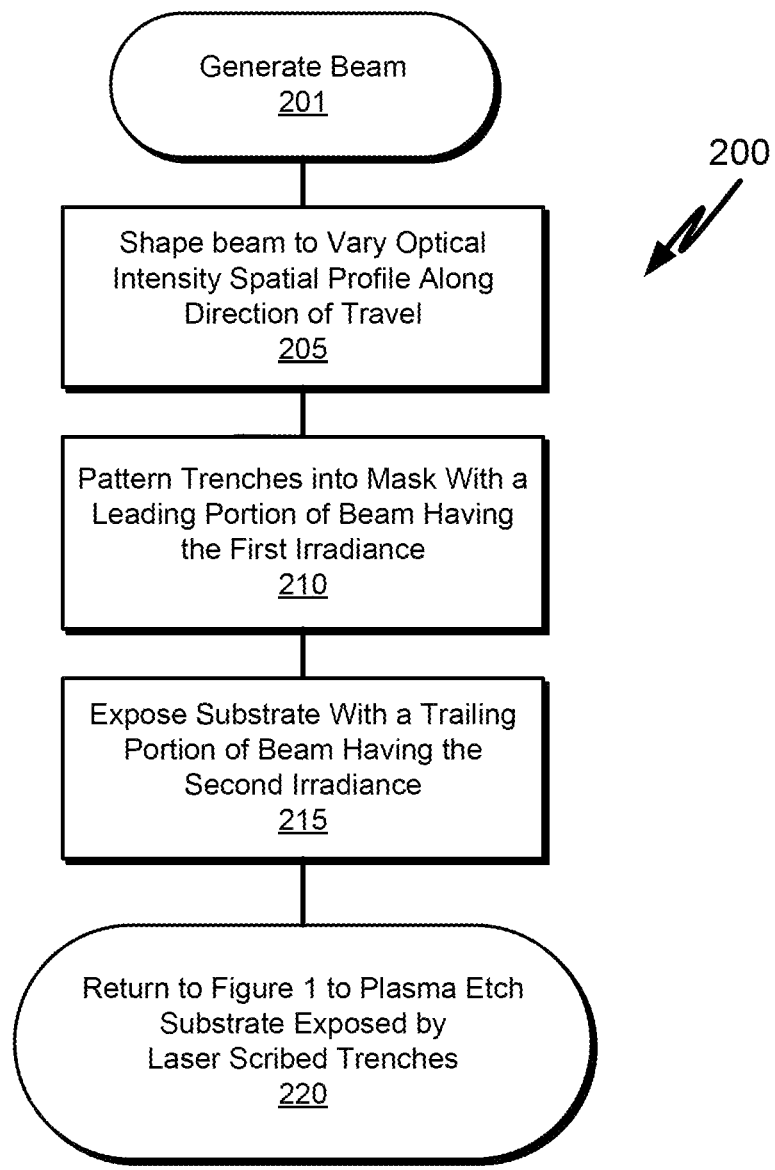
FIG. 2A is a flow diagram illustrating a laser scribing process which may be utilized in FIG. 1, in accordance with an embodiment of the present invention.

FIG. 2A is a flow diagram illustrating an iterative laser scribing process 200 using a beam with a profile shaped as shown in FIG. 3B to implement the first iteration (operation 103) and second iteration (operation 104) in the method 100 (FIG. 1) with a single beam and a single pass. Referring to FIG. 2A, a single beam is generated at operation 201. In an embodiment, the beam has a pulse width (duration) in the femtosecond range (i.e., $10^{-15}$ seconds), referred to herein as a femtosecond laser. Laser parameters selection, such as pulse width, may be critical to developing a successful laser scribing and dicing process that minimizes chipping, microcracks and delamination in order to achieve clean laser scribe cuts. A laser pulse width in the femtosecond range advantageously mitigates heat damage issues relative to longer pulse widths (e.g., picosecond or nanosecond). Although not bound by theory, as currently understood a femtosecond energy source avoids low energy recoupling mechanisms present for picosecond sources and provides for greater thermal nonequilibrium than does a nanosecond-source. With nanosecond or picoseconds laser sources, the various thin film device layer materials present in the street 427 behave quite differently in terms of optical absorption and ablation mechanisms. For example, dielectrics layers such as silicon dioxide, is essentially transparent to all commercially available laser wavelengths under normal conditions. By contrast, metals, organics (e.g., low-κ materials) and silicon can couple photons very easily, particularly nanosecond-based or picosecond-based laser irradiation. If non-optimal laser parameters are selected, in a stacked structures that involve two or more of an inorganic dielectric, an organic dielectric, a semiconductor, or a metal, laser irradiation of the street 427 may disadvantageously cause delamination. For example, a laser penetrating through high bandgap energy dielectrics (such as silicon dioxide with an approximately of 9 eV bandgap) without measurable absorption may be absorbed in an underlying metal or silicon layer, causing significant vaporization of the metal or silicon layers. The vaporization may generate high pressures potentially causing severe interlayer delamination and microcracking. Femtosecond-based laser irradiation processes have been demonstrated to avoid or mitigate such microcracking or delamination of such material stacks.

In an embodiment, the laser source for operation 201 has a pulse repetition rate approximately in the range of 200 kHz to 10 MHz, although preferably approximately in the range of 500 kHz to 5 MHz. The laser emission generated at operation 201 may span any combination of the visible spectrum, the ultra-violet (UV), and/or infra-red (IR) spectrums for a broad or narrow band optical emission spectrum. Even for femtosecond laser ablation, certain wavelengths may provide better performance than others depending on the materials to be ablated. In a specific embodiment, a femtosecond laser suitable for semiconductor substrate or substrate scribing is based on a laser having a wavelength of approximately less than or equal to 1570-200 nanometers, although preferably in the range of 540 nanometers to 250 nanometers. In a particular embodiment, pulse widths are less than or equal to 400 femtoseconds for a laser having a wavelength less than or equal to 540 nanometers. In an alternative embodiments, dual laser wavelengths (e.g., a combination of an IR laser and a UV laser) are used to generate the beam at operation 201. In an embodiment, the laser source delivers pulse energy at the work surface approximately in the range of 0.5 μJ to 100 μJ, although preferably approximately in the range of 1 μJ to 5 μJ.

At operation 205, the generated beam is shaped to vary an optical intensity (irradiance) spatial profile as exemplified by FIG. 3B. Any technique known in the art for providing asymmetric spatial profile may be applied at operation 205. For example, known beam shaping optics may be utilized to generate an elliptical beam with the major axis along the direction of travel. In an embodiment, the elliptical beam has a major axis which is at least 1.5 times longer the minor beam axis. Alternatively, coma may be purposefully introduced in order to create a spatial profile as described in FIG. 3A-3C. Additional known beam shaping techniques may be applied at operation 205 along with known generation techniques at operation 201 to provide the change in intensity, or irradiance, between a leading and trailing portions of the elliptical beam's major axis to provide the asymmetrical profile illustrated in FIG. 3B.

At operations 210 and 215, the spatially shaped beam is controlled to travel a predetermined path relative to the substrate to ablate a point on the mask 402 first with the leading portion of the beam (e.g., as illustrated in FIG. 4B) and to subsequently ablate any underlying thin film device stack disposed over the substrate at that point with the trailing portion of the beam (e.g., as illustrated in FIG. 4C). In an embodiment, the laser scribing process runs along a work piece surface in the direction of travel at a speed approximately in the range of 200 mm/sec to 5 msec, although preferably approximately in the range of 300 mm/sec to 2 msec. At operation 220, method 200 returns to FIG. 1 for plasma etch of the exposed substrate.

Figure 3C:
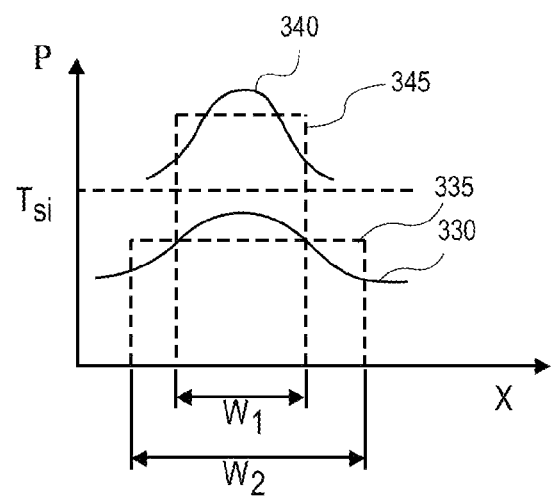
FIG. 3C is a graph of a spatial profiles of laser beams for a multi-pass laser scribing process, in accordance with an embodiment of the present invention.

FIG. 3C is a graph of a spatial profiles 330 and 340 to implement the operations 103 104 in the method 100 (FIG. 1) in a multi-pass embodiment of the present invention. As shown in FIG. 3C, a plurality of beams are provided, each with a different spatial profile. A first profile along a beam width W has a Gaussian 330 or top hat 335 shape with a maximum power (P) below a threshold energy (e.g., $T_{Si}$ in reference to an ablation energy threshold of silicon substrate) while a second beam profile along that same width W has a Gaussian 340 or top hat 345 shape with a maximum power (P) above that threshold energy. As further illustrated in FIG. 3C, the spatial profile 340, 345 associated with the higher irradiance has a power which exceeds the threshold energy ($T_{Si}$) over a width $W_2$ which is less than an equivalently determined width $W_1$ for the spatial profile 330, 335 associated with the lower irradiance.

Figure 2B:
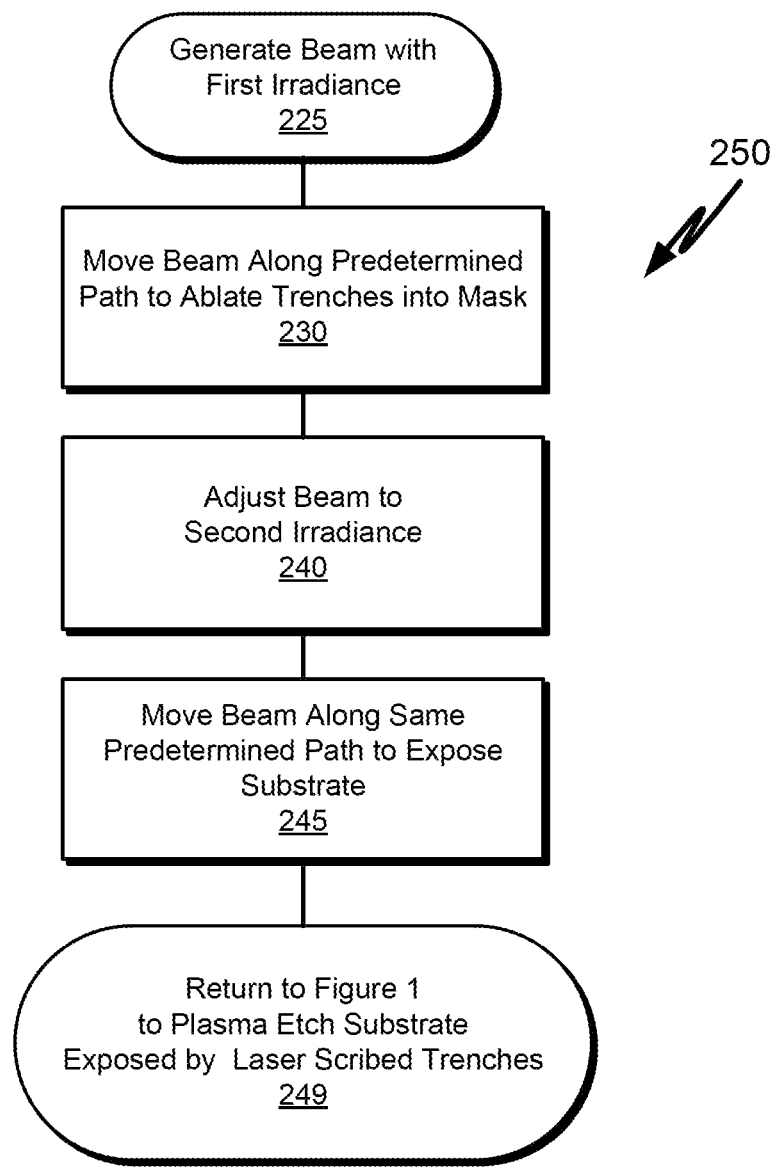
FIG. 2B is a flow diagram illustrating a laser scribing process which may be utilized in FIG. 1, in accordance with an embodiment of the present invention.

FIG. 2B is a flow diagram illustrating a laser scribing method 250 using a plurality of beam profiles shaped as shown in FIG. 3C to implement the first iteration (operation 103) and second iteration (operation 104) in the method 100 (FIG. 1) with multiple passes of a single beam. Referring to FIG. 2B, a single beam is generated at operation 225 to have a first irradiance. The beam generation may proceed substantially as previously described for operation 201, for example employing the same femtosecond pulse widths, wavelengths, pulse rates, etc, a beam with a first irradiance $I_1$, (e.g., Gaussian 330 from FIG. 3C) is generated. At operation 230 the beam is moved along a predetermined path to ablate trenches into the mask, substantially as illustrated in FIG. 4B. In an embodiment, the laser scribing operation 230 runs along a work piece surface in the direction of travel at a speed approximately in the range of 500 mm/sec to 5 msec, although preferably approximately in the range of 600 mm/sec to 2 msec.

At operation 240, the beam is adjusted to have the second irradiance, $I_2$, (e.g., Gaussian 340 from FIG. 3C) is generated. The adjusted beam retraces the same predetermined path to expose the substrate at operation 245 substantially as illustrated in FIG. 4C at substantially the same rate as for operation 240. At operation 249, method 250 returns to FIG. 1 for subsequent plasma etch of the exposed substrate.

Figure 2C:
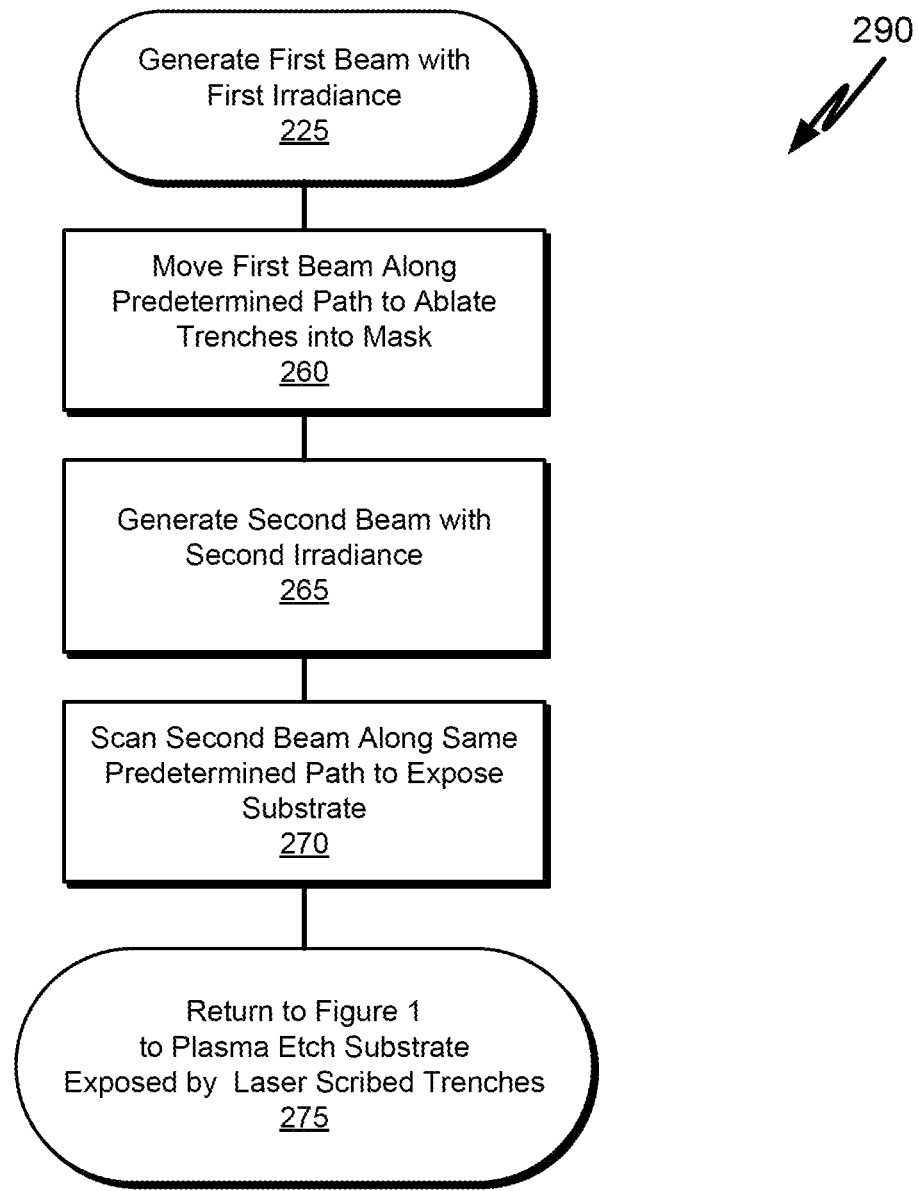
FIG. 2C is a flow diagram illustrating a laser scribing process which may be utilized in FIG. 1, in accordance with an embodiment of the present invention.

FIG. 2C is a flow diagram illustrating an iterative laser scribing process 290 using a plurality of beam profiles shaped as shown in FIG. 3C to implement the first iteration (operation 103) and second iteration (operation 104) in the method 100 (FIG. 1) with successive passes of beams from a plurality of lasers. Referring to FIG. 2C, a first laser generates a beam with a first irradiance $I_1$ (e.g., Gaussian 330 from FIG. 3B) at operation 255. The beam generation may proceed substantially as previously described for operation 201, for example employing the same femtosecond pulse widths, wavelengths, pulse rates, etc. In a preferred embodiment however, the laser utilized at operation 255 has a substantially larger pulse width and may even be a continuous wave (CW) source because of the relative ease by which the trenches may be ablated into a masking material. At operation 260, the first beam is moved along a predetermined path to ablate trenches into the mask, substantially as illustrated in FIG. 4B.

At operation 265, a second laser generates a second beam with a second irradiance. Generation of the second beam with the second irradiance $I_2$ (e.g., Gaussian 335 from FIG. 3B) may proceed substantially as previously described for operation 201, for example employing the same femtosecond pulse widths, wavelengths, pulse rates, etc. In a particular embodiment, where the first laser generates a first pulse train having a first pulse width (CW) at a first wavelength, the second laser generates a second pulse train having a second pulse width and a second wavelength, with at least one of the second pulse width and second wavelength being different than the first pulse width and first wavelength. For example, in the exemplary embodiment where a CW laser is utilized at scribing operation 260, a femtosecond laser generates the second beam at operation 265.

At operation 270 the second laser beam is moved along the same predetermined path to completely ablate the thin film device stack and expose the substrate, substantially as illustrated in FIG. 4C. In an embodiment, the laser scribing operation 270 has both laser beams running along the substrate simultaneously, each with speed in the direction of travel being approximately in the range of 500 mm/sec to 5 msec, although preferably approximately in the range of 600 mm/sec to 2 msec. At operation 275, method 290 returns to FIG. 1 for plasma etch of the exposed substrate.

Figure 4D:
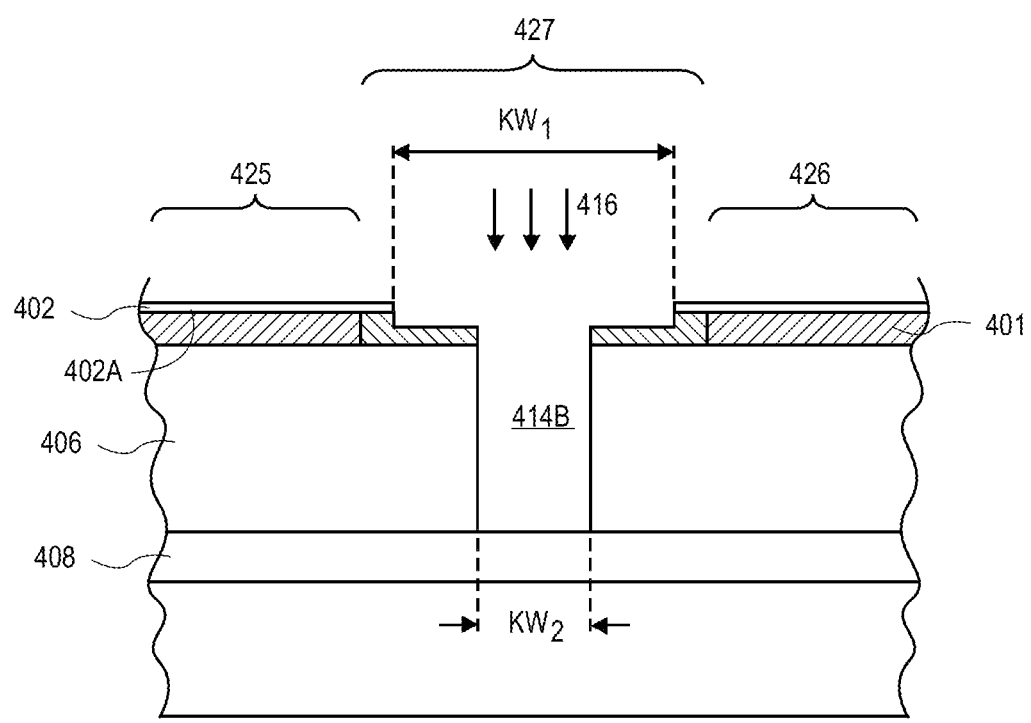
FIG. 4D illustrates a cross-sectional view of a semiconductor substrate including a plurality of ICs corresponding to operation 105 of the dicing method illustrated in FIG. 1, in accordance with an embodiment of the present invention.

Returning to FIGS. 1 and 4D, the substrate 406 is exposed to a plasma 416 to etch through the trenches 414 in the mask 402 to singulate the ICs 426 at operation 105. In the exemplary in-situ mask deposition embodiment, the substrate is etched in the same chamber that performed the plasma mask deposition operation 102. In accordance with an embodiment of the present invention, etching the substrate 406 at operation 105 includes etching the trenches 414B formed with the laser scribing process to ultimately etch entirely through substrate 406, as depicted in FIG. 4D.

In one embodiment, the etch operation 105 entails a through via etch process. For example, in a specific embodiment, the etch rate of the material of substrate 406 is greater than 25 μms per minute. A high-density plasma source operating at high powers may be used for the plasma etching operation 105. Exemplary powers range between 3 kW and 6 kW, or more.

In an exemplary embodiment, a deep silicon etch (i.e., such as a through silicon via (TSV) etch) is used to etch a single crystalline silicon substrate or substrate 406 at an etch rate greater than approximately 40% of conventional silicon etch rates while maintaining essentially precise profile control and virtually scallop-free sidewalls. Effects of the high power on any water soluble material layer present in the mask 402 are controlled through application of cooling power via an electrostatic chuck (ESC) chilled to −10° C. to −15° C. to maintain the water soluble mask material layer at a temperature below 100° C. and preferably between 70° C. and 80° C. throughout the duration of the plasma etch process. At such temperatures, water solubility is advantageously maintained.

In a specific embodiment, the plasma etch operation 105 further entails a plurality of protective polymer deposition cycles interleaved over time with a plurality of etch cycles. The duty cycle may vary with the exemplary duty cycle being approximately 1:1-1:2 (etch:dep). For example, the etch process may have a deposition cycle with a duration of 250 msec-750 msec and an etch cycle of 250 msec-750 msec. Between the deposition and etch cycles, an etching process chemistry, employing for example $SF_6$ for the exemplary silicon etch embodiment, is alternated with a deposition process chemistry employing a polymerizing fluorocarbon ($C_xF_y$) gas such as, but not limited to, $C_4F_6$ or $C_4F_8$ or fluorinated hydrocarbon ($CH_xF_y$, with x>=1), or $XeF_2$. Process pressures may further be alternated between etch and deposition cycles to favor each in the particular cycle, as known in the art.

At operation 107, method 300 is completed with removal of the mask 402. In an embodiment, a water soluble mask layer is washed off with water, for example with a pressurized jet of de-ionized water or through submergence in an ambient or heated water bath. In alternative embodiments, the mask 402 may be washed off with aqueous solvent solutions known in the art to be effective for etch polymer removal. Either of the plasma singulation operation 105 or mask removal process at operation 107 may further pattern the die attach film 408, exposing the top portion of the backing tape 410.

Figure 6A:
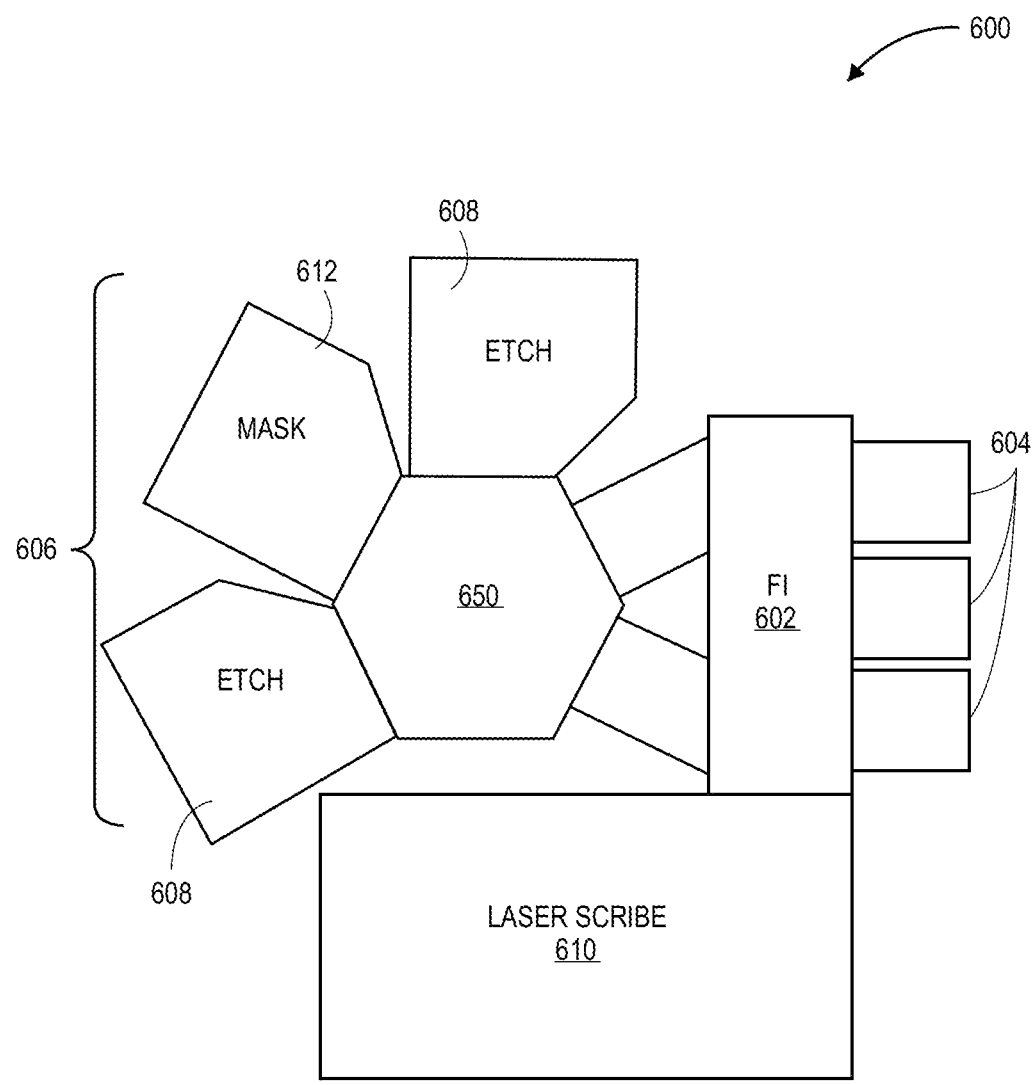
FIG. 6A illustrates a block diagram of an integrated platform layout for laser and plasma dicing of substrates, in accordance with an embodiment of the present invention.

A single integrated process tool 600 may be configured to perform many or all of the operations in the hybrid laser ablation-plasma etch singulation process 100. For example, FIG. 6 illustrates a block diagram of a cluster tool 606 coupled with laser scribe apparatus 610 for laser and plasma dicing of substrates, in accordance with an embodiment of the present invention. Referring to FIG. 6, the cluster tool 606 is coupled to a factory interface 602 (FI) having a plurality of load locks 604. The factory interface 602 may be a suitable atmospheric port to interface between an outside manufacturing facility with laser scribe apparatus 610 and cluster tool 606. The factory interface 602 may include robots with arms or blades for transferring substrates (or carriers thereof) from storage units (such as front opening unified pods) into either cluster tool 606 or laser scribe apparatus 610, or both.

Figure 6B:
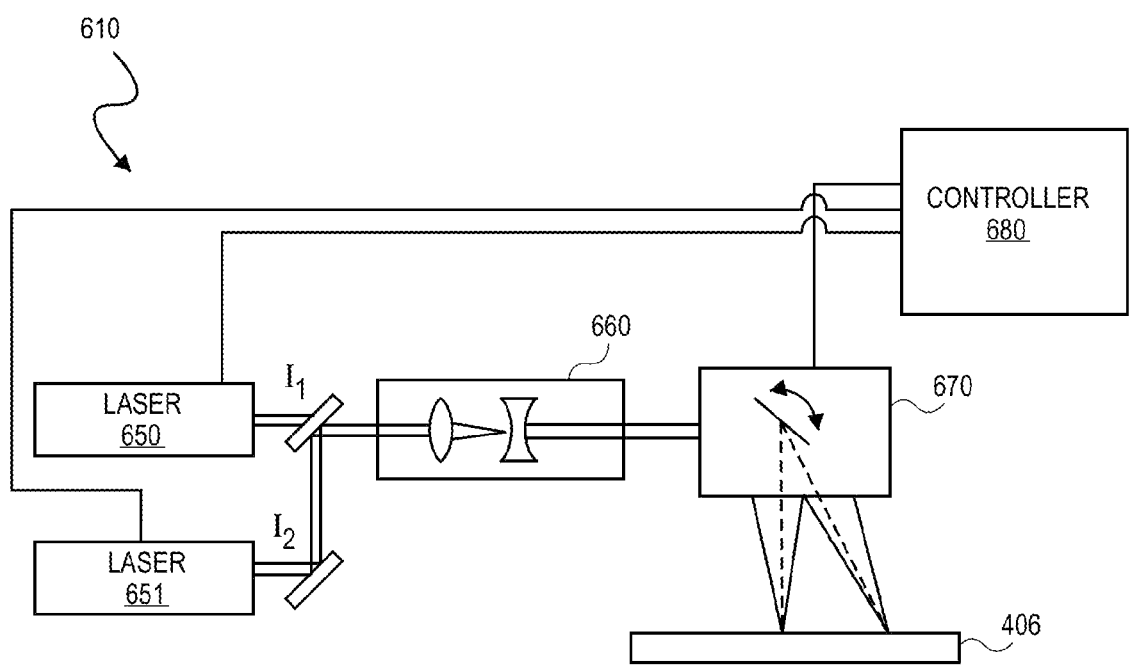
FIG. 6B illustrates a block diagram of a laser scribing module for laser scribing, in accordance with an embodiment of the present invention.

A laser scribe apparatus 610 is also coupled to the FI 602. FIG. 6B illustrates an exemplary functional block diagram of the laser scribe apparatus 610. In an embodiment illustrated in FIG. 6B, the laser scribe apparatus 610 includes a femtosecond laser 665. The femtosecond laser 665 is to performing the laser ablation portion of the hybrid laser and etch singulation process 100. In one embodiment, a moveable stage (not depicted) for supporting the substrate 406 is also included in laser scribe apparatus 610, the moveable stage is configured for moving the substrate 406 (or a carrier thereof) relative to the femtosecond laser 665. As further illustrated, the laser scribe apparatus includes a scanner 670 (e.g., galvanometer) with a mirror movable to scan the laser beam in response to control signals from the controller 680. Between the femtosecond laser 665 and scanner 670 are beam shaping optics 660 which in one embodiment provide an asymmetrically shaped beam profile substantially as shown in FIG. 3B to perform the iterative laser scribing process 200. In further embodiments, the controller 680 is coupled to the femtosecond laser 665 to modulate irradiance of the femtosecond laser 665 across a plurality of non-zero irradiances over time, substantially as illustrated in FIG. 3A, and/or over space substantially as illustrated in FIG. 3C to perform the scribing method 250. In another embodiment, the laser scribe apparatus 610 further includes a second laser 666 which may be femtosecond or otherwise. The second laser 666 is coupled to the controller 680 and each of the lasers 665 and 666 are operated through the scanner 670 successively in time, or simultaneously through separate scanners (i.e., scanner 670 is replicated for completely separate optical paths between the substrate 406 and the lasers), with the controller 680 to direct iterative ablation over substantially the same path to perform the scribing process 290.

Returning to FIG. 6A, the cluster tool 606 includes one or more plasma etch chambers 608 coupled to the FI by a robotic transfer chamber 650 housing a robotic arm for in-vaccuo transfer of substrates between the laser scribe apparatus 610, plasma etch chamber 608 and/or mask module 612. The plasma etch chambers 608 is suitable for at least the plasma etch portion of the hybrid laser and etch singulation process 100 and may further deposit a polymer mask over the substrate. In one exemplary embodiment, the plasma etch chamber 608 is further coupled to an $SF_6$ gas source and at least one of a $C_4F_8$, $C_4F_6$, or $CH_2F_2$ source. In a specific embodiment, the one or more plasma etch chambers 608 is an Applied Centura® Silvia™ Etch system, available from Applied Materials of Sunnyvale, Calif., USA, although other suitable etch systems are also available commercially. The Applied Centura® Silvia™ Etch system provides capacitive and inductive RF coupling for independent control of the ion density and ion energy than possible with capacitive coupling only, even with the improvements provided by magnetic enhancement. This enables one to effectively decouple the ion density from ion energy, so as to achieve relatively high density plasmas without the high, potentially damaging, DC bias levels, even at very low pressures (e.g., 5-10 mTorr). This results in an exceptionally wide process window. However, any plasma etch chamber capable of etching silicon may be used. In an embodiment, more than one plasma etch chamber 608 is included in the cluster tool 606 portion of the single integrated process tool 600 to enable high manufacturing throughput of the singulation or dicing process.

The cluster tool 606 may include other chambers suitable for performing functions in the hybrid laser ablation-plasma etch singulation process 100. In the exemplary embodiment illustrated in FIG. 6, a mask module 612 includes any commercially available spin coating module for application of the water soluble mask layer described herein. The spin coating module may include a rotatable chuck adapted to clamp by vacuum, or otherwise, a thinned substrate mounted on a carrier such as backing tape mounted on a frame.

Figure 7:
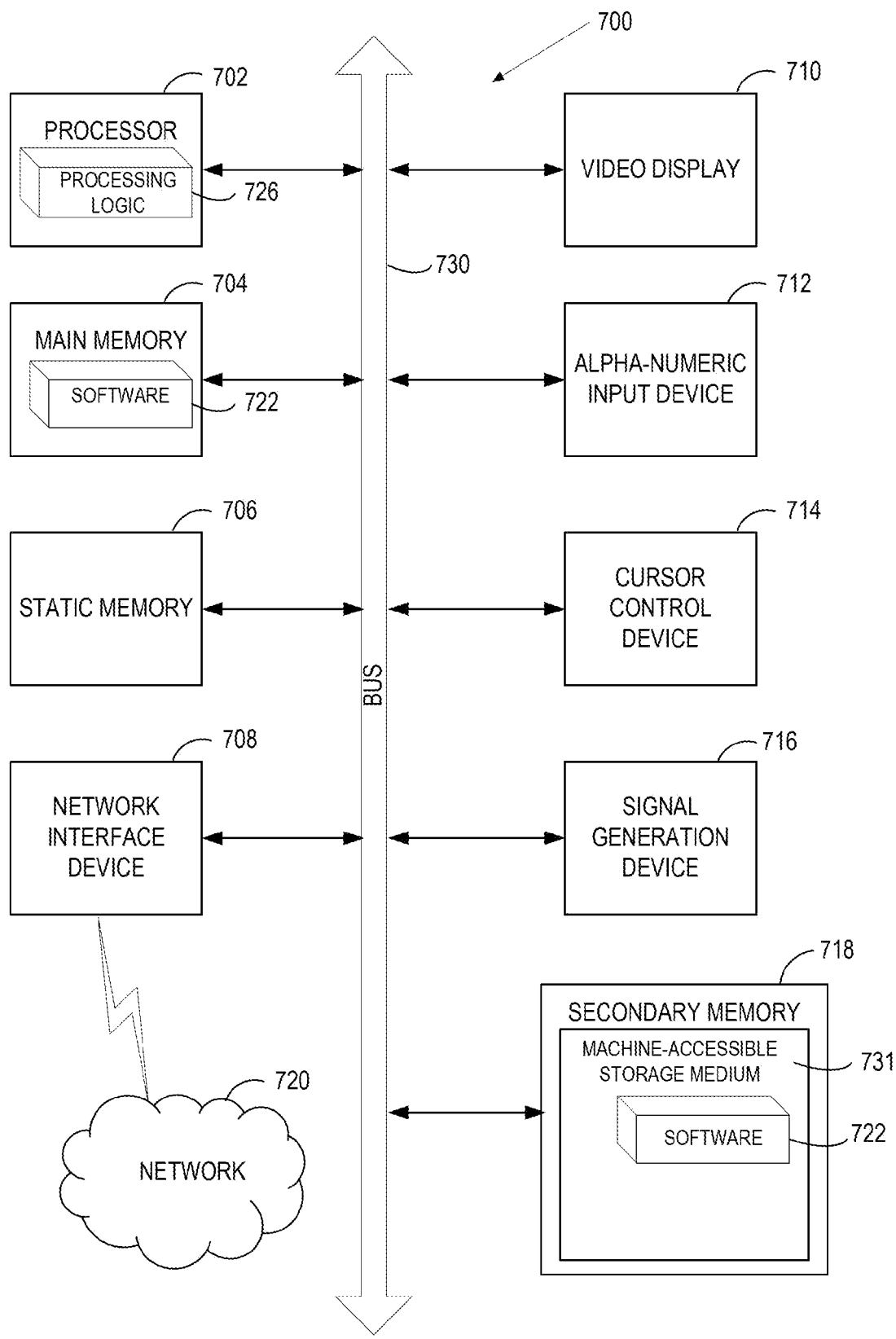
FIG. 7 illustrates a block diagram of an exemplary computer system which controls automated performance of one or more operation in the laser scribing methods described herein, in accordance with an embodiment of the present invention.

FIG. 7 illustrates a computer system 700 within which a set of instructions, for causing the machine to execute one or more of the scribing methods discussed herein may be executed. The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, etc. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations and steps discussed herein.

The computer system 700 may further include a network interface device 708. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 731 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

The machine-accessible storage medium 731 may also be used to store pattern recognition algorithms, artifact shape data, artifact positional data, or particle sparkle data. While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, methods of dicing semiconductor substrates, each substrate having a plurality of ICs, have been disclosed. The above description of illustrative embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The scope of the invention is therefore to be determined entirely by the following claims, which are to be construed in accordance with established doctrines of claim interpretation.

What is claimed is:

1. A method of dicing a substrate comprising a plurality of ICs, the method comprising:
receiving the substrate with an unpatterned mask covering and protecting the ICs;
ablating with a laser a predetermined pattern of trenches into the mask and into a thin film IC stack disposed below the mask to expose a portion of a substrate, the ablating leading with electromagnetic radiation having a first irradiance and following with electromagnetic radiation having a second irradiance, different than the first; and
plasma etching through the substrate exposed by the patterned mask trenches to singulate the ICs.

2. The method of claim 1, wherein one of the first and second irradiance is insufficient to ablate the substrate and wherein the other of the first and second irradiance is sufficient to ablate the substrate.

3. The method of claim 2, wherein one of the first and second irradiance is insufficient to ablate an interconnect metal of the thin film IC stack and wherein one of the first and second irradiance is sufficient to ablate the interconnect metal.

4. The method of claim 3, wherein the first irradiance is less than 0.01 $GW/cm^2$ and the second irradiance is greater than 0.1 $GW/cm^2$.

5. The method of claim 1, wherein the first irradiance forms a trench in the mask having a first kerf width and wherein the second irradiance forms a trench in the thin film IC stack having a second kerf width, different than the first kerf width.

6. The method of claim 5, wherein the first kerf width is greater than the second kerf.

7. The method of claim 2, wherein the ablating further comprises shaping a laser beam to have an asymmetrically varying irradiance profile along a direction of travel and patterning the trenches into the mask with a leading laser beam portion having the first irradiance and ablating the thin film IC stack with a trailing laser beam portion having the second irradiance to expose the substrate.

8. The method of claim 2, wherein the ablating comprises a laser having a wavelength less than or equal to 540 nanometers and a pulse width less than or equal to 400 femtoseconds.

9. The method of claim 2, wherein the ablating comprises a first laser pass at the first irradiance and a second laser pass at the second irradiance.

10. The method of claim 7, wherein the first and second laser pass is with a first laser and wherein the second laser pass is with a second laser.

11. The method of claim 10, wherein the first laser generates a first pulse train having a first pulse width and a first wavelength, and wherein the second laser generates a second pulse train having a second pulse width and a second wavelength, at least one of the second pulse width and second wavelength being different than the first pulse width and first wavelength.

12. The method of claim 1, wherein forming the mask further comprises forming a polymeric material layer to a thickness of no more than 20 .mu.m over a street between the ICs.

13. A method of dicing a silicon substrate comprising a plurality of ICs, the method comprising:
receiving a substrate with a mask covering and protecting the ICs;
ablating with a femtosecond laser a predetermined pattern of trenches into the mask and into a thin film IC stack disposed below the mask to expose a portion of a substrate, the ablating leading with a first irradiance and following with second irradiance, different than the first; and
plasma etching through the silicon substrate exposed by the patterned mask trenches to singulate the ICs.

14. The method of claim 13, wherein the trenches in the mask are ablated with a first kerf width and wherein the thin film IC stack is ablated with a second kerf, different than the first kerf width.

* * * * *

UNITED STATES PATENT AND TRADEMARK OFFICE
CERTIFICATE OF CORRECTION

PATENT NO.         : 8,759,197 B2
APPLICATION NO.    : 13/160822
DATED              : June 24, 2014
INVENTOR(S)        : Holden It is certified that error appears in the above-identified patent and that said Letters Patent is hereby corrected as shown below:

In the Specification

Column 2, line 15, replace "multiple lasers" with "multiple of lasers"

Column 3, line 1, replace "graph of a spatial profiles" with "graph of spatial profiles"

Column 3, lines 20-21, replace "view of an mask" with "view of a mask"

Column 4, line 6, replace "cause an effect" with "cause and effect"

Column 4, lines 38-39, replace "scribing is an essentially" with "scribing is essentially"

Column 6, line 54, replace "FIGS. 4B 4C" with "FIGS. 4B and 4C"

Column 7, line 10, replace "KW$_2$ As one" with "KW$_2$. As one"

Column 8, line 19, replace "dielectrics layers" with "dielectric layers"

Column 8, line 23, replace "particularly nanosecond-based" with "particularly in nanosecond-based"

Column 8, lines 24-25, replace "selected, in a stacked structures" with "selected for stacked structures"

Column 8, line 30, replace "with an approximately of 9 eV" with "with approximately 9 eV"

Column 9, line 23, replace "operations 103 104" with "operations 103 and 104"

Column 9, line 57, replace "FIG. 3C) is generated" with "FIG. 3C) generated"

Signed and Sealed this
Thirtieth Day of September, 2014

Michelle K. Lee
*Deputy Director of the United States Patent and Trademark Office*

CERTIFICATE OF CORRECTION (continued)
U.S. Pat. No. 8,759,197 B2

Column 10, line 51, replace "25 μms per minute" with "25 μm per minute"

Column 11, line 46, replace "laser 665 is to performing" with "laser 665 performs"

In the Claims

Column 14, line 47, Claim 12, replace "20 .mu.m over" with "20 μm over"